United States Patent
Chen et al.

(10) Patent No.: US 11,309,433 B2
(45) Date of Patent: Apr. 19, 2022

(54) NON-VOLATILE MEMORY STRUCTURE AND MANUFACTURING METHOD THEREOF

(71) Applicant: Winbond Electronics Corp., Taichung (TW)

(72) Inventors: Yi-Hui Chen, Taichung (TW); Chih-Hao Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 22 days.

(21) Appl. No.: 16/822,030

(22) Filed: Mar. 18, 2020

(65) Prior Publication Data
US 2021/0296486 A1   Sep. 23, 2021

(51) Int. Cl.
| H01L 29/788 | (2006.01) |
|---|---|
| H01L 29/66 | (2006.01) |
| H01L 29/49 | (2006.01) |
| H01L 21/764 | (2006.01) |
| H01L 29/51 | (2006.01) |

(52) U.S. Cl.
CPC .......... H01L 29/788 (2013.01); H01L 21/764 (2013.01); H01L 29/4991 (2013.01); H01L 29/515 (2013.01); H01L 29/66825 (2013.01)

(58) Field of Classification Search
CPC ... H01L 29/66825; H01L 29/788–7889; H01L 29/7813; H01L 29/7825; H01L 29/66613–66628; H01L 29/42336; H01L 29/42352; H01L 29/42356; H01L 29/4236; H01L 29/4991; H01L 21/764
See application file for complete search history.

(56) References Cited

U.S. PATENT DOCUMENTS

| 6,475,894 | B1 * | 11/2002 | Huang | H01L 27/115 438/593 |
|---|---|---|---|---|
| 7,038,291 | B2 * | 5/2006 | Goda | H01L 27/115 257/510 |
| 7,605,036 | B2 * | 10/2009 | Jung | H01L 27/115 438/264 |
| 8,778,749 | B2 * | 7/2014 | Pachamuthu | H01L 21/764 438/201 |
| 8,865,562 | B2 * | 10/2014 | Lee | H01L 27/11524 438/422 |

(Continued)

FOREIGN PATENT DOCUMENTS

| TW | 480715 | 3/2002 |
|---|---|---|
| TW | 202002251 | 1/2020 |

OTHER PUBLICATIONS

"Office Action of Taiwan Counterpart Application", dated Oct. 7, 2020, p. 1-p. 4.

*Primary Examiner* — Maliheh Malek
(74) *Attorney, Agent, or Firm* — JCIPRNET

(57) ABSTRACT

A non-volatile memory structure including a substrate, a plurality of charge storage layers, a first dielectric layer, and a control gate is provided. The charge storage layers are located on the substrate. An opening is provided between two adjacent charge storage layers. The first dielectric layer is located on the charge storage layers and on a surface of the opening. A bottom cross-sectional profile of the first dielectric layer located in the opening is a profile that is recessed on both sides. The control gate is located on the first dielectric layer and fills the opening.

13 Claims, 9 Drawing Sheets

(56) References Cited

U.S. PATENT DOCUMENTS

| | | | |
|---|---|---|---|
| 8,883,611 B2 * | 11/2014 | Lee | H01L 21/76229 438/421 |
| 8,962,444 B2 | 2/2015 | Kim et al. | |
| 9,035,419 B2 | 5/2015 | Oh et al. | |
| 9,524,974 B1 * | 12/2016 | Kanezaki | H01L 21/76804 |
| 9,748,332 B1 * | 8/2017 | Yang | H01L 29/0649 |
| 9,859,288 B2 * | 1/2018 | Oh | H01L 21/764 |
| 10,418,440 B2 * | 9/2019 | Liu | H01L 29/0653 |
| 10,566,337 B2 * | 2/2020 | Liu | H01L 27/11541 |
| 10,720,533 B2 * | 7/2020 | Hsieh | H01L 29/40114 |
| 10,840,382 B2 * | 11/2020 | Hsieh | H01L 21/0262 |
| 10,896,911 B2 * | 1/2021 | Cho | H01L 21/31111 |
| 11,101,272 B2 * | 8/2021 | Lin | H01L 27/10855 |
| 2006/0131655 A1 * | 6/2006 | Kunnen | H01L 25/50 257/369 |
| 2007/0128797 A1 | 6/2007 | Cho | |
| 2007/0148872 A1 * | 6/2007 | Jung | H01L 27/115 438/264 |
| 2007/0284648 A1 * | 12/2007 | Park | H01L 29/792 257/316 |
| 2008/0085583 A1 * | 4/2008 | Park | H01L 21/02304 438/261 |
| 2009/0085096 A1 * | 4/2009 | Park | H01L 27/11573 257/324 |
| 2010/0019311 A1 * | 1/2010 | Sato | H01L 29/7881 257/326 |
| 2010/0127320 A1 * | 5/2010 | Nishihara | H01L 21/764 257/326 |
| 2010/0224926 A1 * | 9/2010 | Hatakeyama | H01L 27/11524 257/319 |
| 2010/0230741 A1 * | 9/2010 | Choi | H01L 21/76229 257/324 |
| 2011/0309430 A1 * | 12/2011 | Purayath | H01L 27/11524 257/321 |
| 2012/0007165 A1 * | 1/2012 | Lee | H01L 29/40114 257/316 |
| 2012/0037975 A1 * | 2/2012 | Cho | H01L 29/42336 257/321 |
| 2012/0049266 A1 * | 3/2012 | Oh | H01L 27/11519 257/316 |
| 2012/0052668 A1 * | 3/2012 | Lin | H01L 27/10891 438/589 |
| 2012/0070976 A1 * | 3/2012 | Kim | H01L 21/764 438/594 |
| 2012/0126303 A1 * | 5/2012 | Arai | H01L 21/764 257/316 |
| 2012/0132982 A1 * | 5/2012 | Lee | H01L 21/7682 257/321 |
| 2012/0202335 A1 * | 8/2012 | Lee | H01L 21/76229 438/424 |
| 2012/0211860 A1 * | 8/2012 | Takekida | H01L 21/76224 257/499 |
| 2013/0015518 A1 * | 1/2013 | Sato | H01L 29/7881 257/321 |
| 2013/0049085 A1 * | 2/2013 | Lin | H01L 27/10885 257/296 |
| 2013/0056817 A1 * | 3/2013 | Kim | H01L 21/764 257/321 |
| 2013/0084696 A1 * | 4/2013 | Kim | H01L 21/76801 438/588 |
| 2013/0277730 A1 * | 10/2013 | Jung | H01L 21/764 257/316 |
| 2014/0024192 A1 * | 1/2014 | Kim | H01L 29/165 438/296 |
| 2014/0151779 A1 * | 6/2014 | Cho | H01L 21/022 257/316 |
| 2014/0227858 A1 * | 8/2014 | Shen | H01L 21/76229 438/430 |
| 2014/0264535 A1 * | 9/2014 | Sasaki | H01L 29/66833 257/316 |
| 2016/0260726 A1 * | 9/2016 | Shin | H01L 21/823462 |
| 2017/0084696 A1 * | 3/2017 | Lee | H01L 27/11565 |
| 2017/0287922 A1 * | 10/2017 | Li | H01L 27/11521 |
| 2018/0122809 A1 * | 5/2018 | Lin | H01L 27/10897 |
| 2018/0174971 A1 * | 6/2018 | Song | H01L 27/10852 |
| 2018/0197871 A1 * | 7/2018 | Chiu | H01L 21/32139 |
| 2018/0308929 A1 * | 10/2018 | Liu | H01L 27/11517 |
| 2018/0350608 A1 * | 12/2018 | Liu | H01L 29/42324 |
| 2019/0157275 A1 * | 5/2019 | Lee | H01L 23/5283 |
| 2019/0385892 A1 * | 12/2019 | Singh | H01L 29/0649 |
| 2020/0105535 A1 * | 4/2020 | Lin | H01L 21/764 |
| 2020/0286894 A1 * | 9/2020 | Lin | H01L 27/10855 |
| 2020/0388694 A1 * | 12/2020 | Cheng | H01L 29/515 |
| 2020/0395238 A1 * | 12/2020 | Cheng | H01L 29/0847 |
| 2021/0090953 A1 * | 3/2021 | Soma | H01L 21/3086 |

\* cited by examiner

NON-VOLATILE MEMORY STRUCTURE AND MANUFACTURING METHOD THEREOF

BACKGROUND

Technical Field

The disclosure relates to a semiconductor structure and a manufacturing method thereof, and in particular, to a non-volatile memory structure and a manufacturing method thereof.

Description of Related Art

Non-volatile memory may perform operations such as storing, reading, and erasing for a plurality of times. Further, the non-volatile memory exhibits advantages that the stored data does not disappear when the power supply is interrupted, data access time is short, and power consumption is low. The non-volatile memory thereby has become a memory widely used in personal computers and electronic devices. However, how to further improve the electrical performance of the memory device is the goal of the ongoing efforts of the industry.

SUMMARY

The disclosure provides a non-volatile memory structure and a manufacturing method thereof, which may improve electrical performance of a memory device.

The disclosure provides a non-volatile memory structure including a substrate, a plurality of charge storage layers, a first dielectric layer, and a control gate. The charge storage layers are located on the substrate. An opening is provided between two adjacent charge storage layers. The first dielectric layer is located on the charge storage layers and on a surface of the opening. A bottom cross-sectional profile of the first dielectric layer located in the opening is a profile that is recessed on both sides. The control gate is located on the first dielectric layer and fills the opening.

The disclosure provides a manufacturing method of a non-volatile memory structure, and the manufacturing method includes the following steps. A plurality of charge storage layers are formed on a substrate. An opening is provided between two adjacent charge storage layers. A first dielectric layer is formed on the charge storage layers and on a surface of the opening. A bottom cross-sectional profile of the first dielectric layer located in the opening is a profile that is recessed on both sides. A control gate is formed on the first dielectric layer. The control gate fills the opening.

Based on the above, in the non-volatile memory structure and the manufacturing method thereof proposed in the disclosure, since the bottom cross-sectional profile of the first dielectric layer located in the opening is a profile that is recessed on both sides and the control gate fills the opening and is located on the first dielectric layer with a recessed profile, a coupling ratio between the control gate and the charge storage layers may be effectively increased, thereby improving electrical performance of the memory device.

In order to make the foregoing features and advantages of the disclosure more apparent and easier to understand, the following gives descriptions in detail by listing embodiments with reference to the accompanying drawings.

DESCRIPTION OF THE EMBODIMENTS

Figure 1:
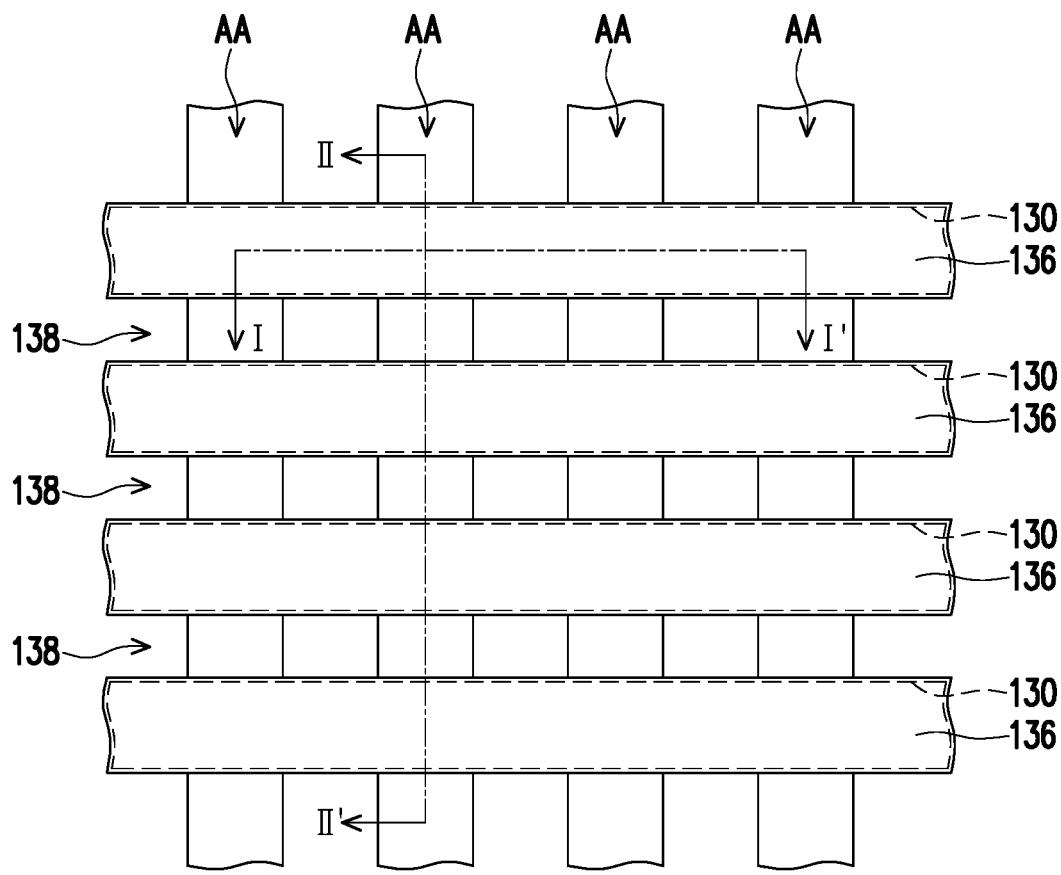
FIG. 1 is a top view of a non-volatile memory structure according to an embodiment of the disclosure.
Figure 2A:
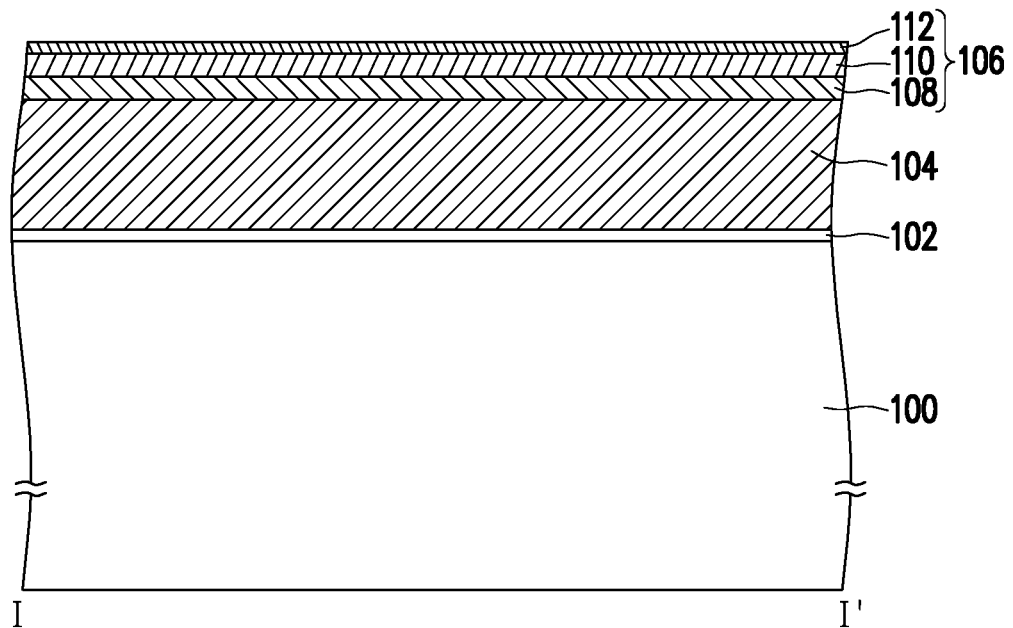
FIG. 2A to FIG. 2N are each a cross-sectional view of a manufacturing process of the non-volatile memory structure taken along a section line in FIG. 1.

FIG. 1 is a top view of a non-volatile memory structure according to an embodiment of the disclosure. FIG. 2A to FIG. 2N are each a cross-sectional view of a manufacturing process of the non-volatile memory structure taken along a section line in FIG. 1. Some components in FIG. 2A to FIG. 2N are omitted in FIG. 1 to clearly illustrate an arrangement relationship between the components in FIG. 1.

FIG. 2A to FIG. 2L are each a cross-sectional view taken along a section line I-I' in FIG. 1. Referring to FIG. 2A, a gate dielectric material layer 102 may be formed on a substrate 100. The gate dielectric material layer 102 is made of, for example, silicon oxide. A method for forming the gate dielectric material layer 102 is, for example, a thermal oxidation method.

Then, a charge storage material layer 104 may be formed on the gate dielectric material layer 102. The charge storage material layer 104 may be a single-layer structure or a multilayer structure. The charge storage material layer 104 may be made of a floating gate material, such as doped polysilicon, undoped polysilicon, or a combination thereof.

Then, a hard mask layer 106 may be formed on the charge storage material layer 104. The hard mask layer 106 may be a single-layer structure or a multilayer structure. In the present embodiment, that the hard mask layer 106 is a multilayer structure is used as an example, but the disclosure is not limited thereto. The hard mask layer 106 may include a mask layer 108, a mask layer 110, and a mask layer 112. In some embodiments, the mask layer 108 may be made of silicon oxide, the mask layer 110 may be made of silicon nitride, and the mask layer 112 may be made of silicon oxide, but the disclosure is not limited thereto. The mask layer 108, the mask layer 110, and the mask layer 112 may be formed using a chemical vapor deposition method, respectively.

Figure 2B:
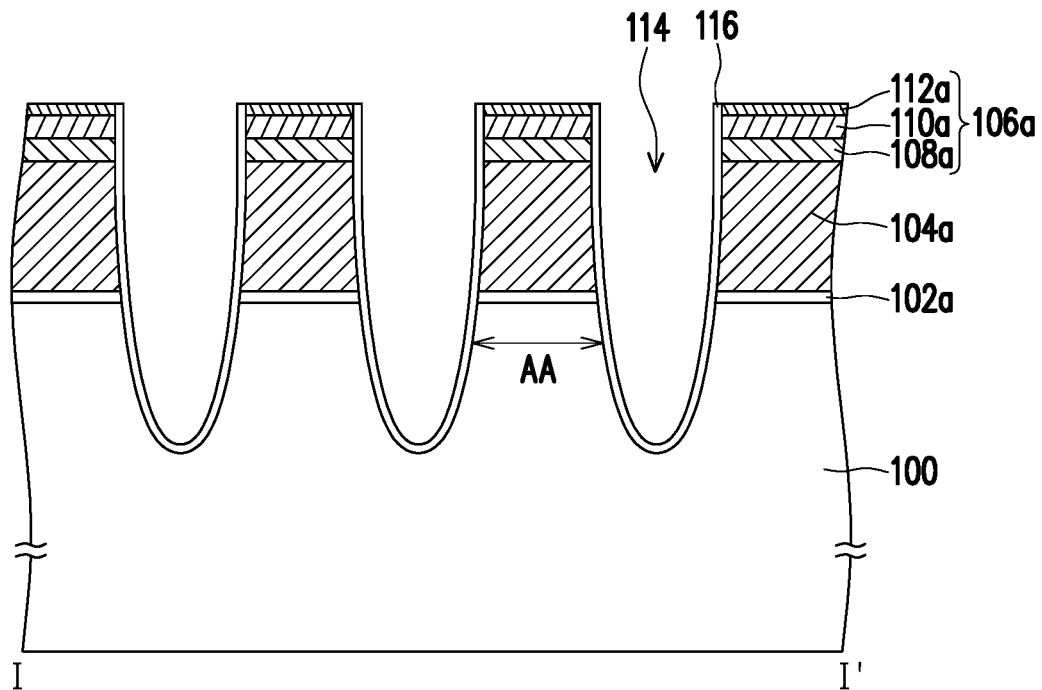

Referring to FIG. 2B, the hard mask layer 106, the charge storage material layer 104, the gate dielectric material layer 102, and the substrate 100 are patterned to form a patterned hard mask layer 106a, a plurality of charge storage layers 104a, and a plurality of gate dielectric layers 102, and a trench 114 is formed in the substrate 100. The trench 114 may extend between two adjacent charge storage layers 104a and into the patterned hard mask layer 106a. Accordingly, the plurality of charge storage layers 104a are formed on the substrate 100. In some embodiments, the charge storage layers 104a may be floating gates, but the disclosure is not limited thereto. In addition, the trench 114 may define an active region AA in the substrate 100. The foregoing patterning process is, for example, a combination of a lithography process and an etching process. In addition, the patterned hard mask layer 106a may include a mask layer 108a, a mask layer 110a, and a mask layer 112a formed by patterning the mask layer 108, the mask layer 110, and the mask layer 112.

Then, a dielectric layer 116 may be formed on a surface of the trench 114. The dielectric layer 116 is, for example, an oxide layer. A method for forming the dielectric layer 116 is, for example, a thermal oxidation method.

Figure 2C:
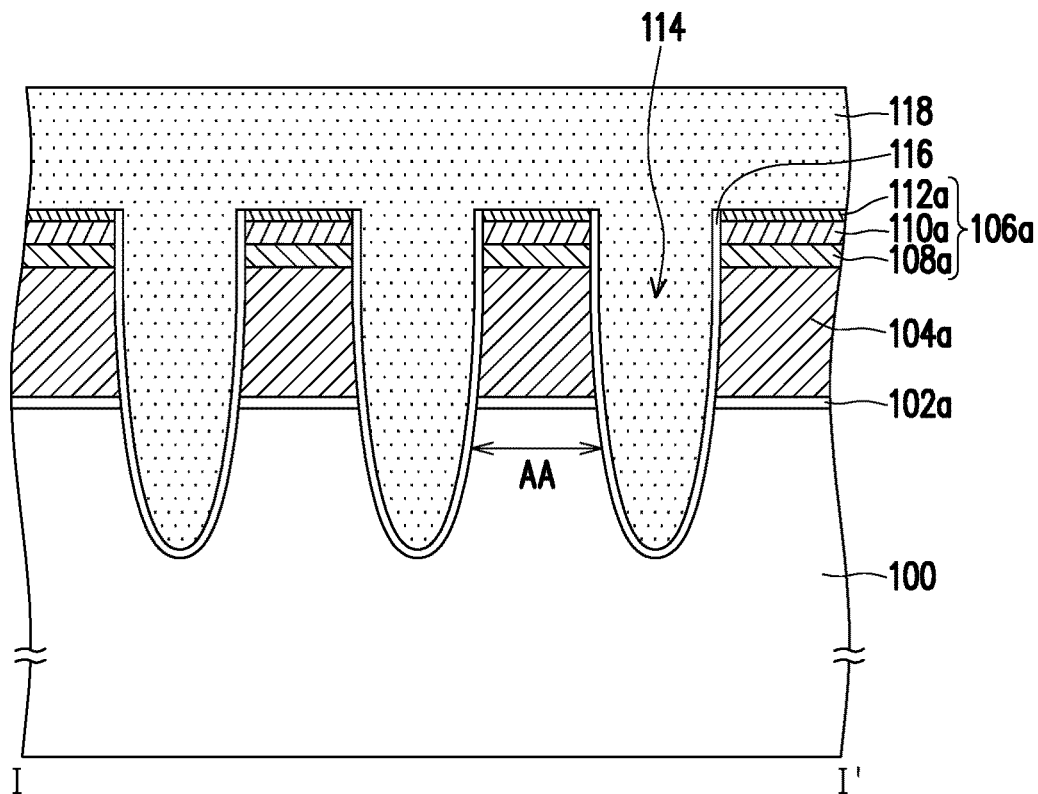

Referring to FIG. 2C, a filling material layer 118 filling the trench 114 may be formed. The filling material layer 118 is made of, for example, spin on carbon (SOC) formed by spin coating. A method for forming the filling material layer 118 is, for example, a spin coating method.

Figure 2D:
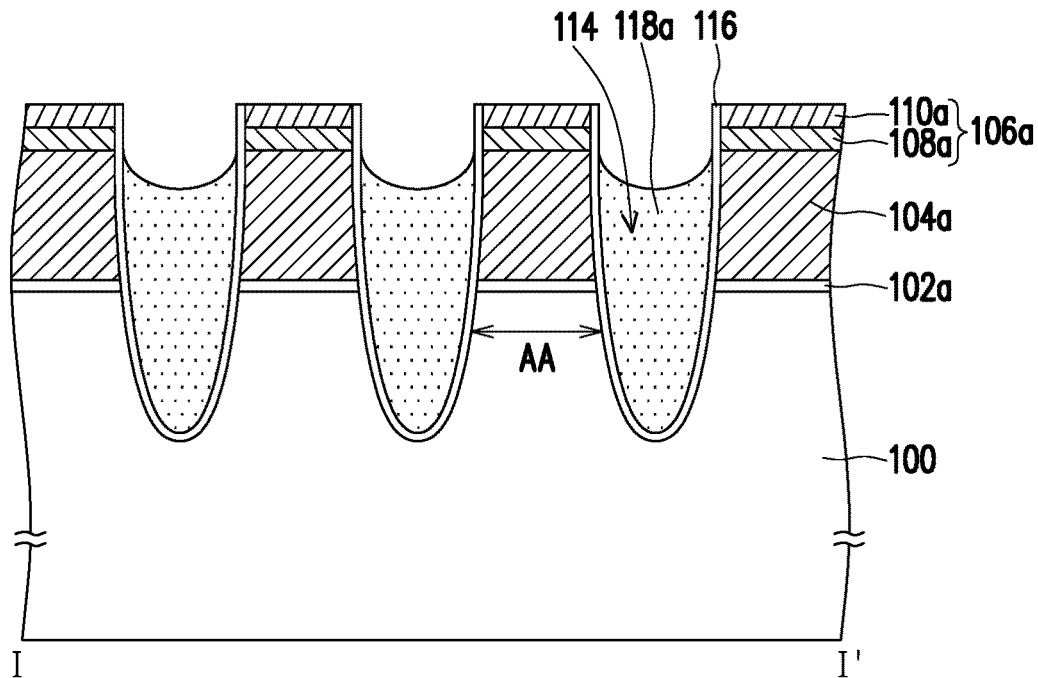

Referring to FIG. 2D, a portion of the filling material layer 118 may be removed, and a filling layer 118a is formed in the trench 114. A top of the filling layer 118a may be lower than a top of the patterned hard mask layer 106a, but the disclosure is not limited thereto. The method for removing a portion of the filling material layer 118 is, for example, a dry etching method or a combination of a chemical mechanical polishing method and a dry etching method. In addition, in the process of removing the portion of the filling material layer 118, the mask layer 112a may also be removed, but the disclosure is not limited thereto. For example, a portion of the filling material layer 118 and the mask layer 112a may be removed by a chemical mechanical polishing process, and then a portion of the filling material layer 118 in the trench 114 may be removed by a dry etching process to form a filling layer 118a.

Figure 2E:
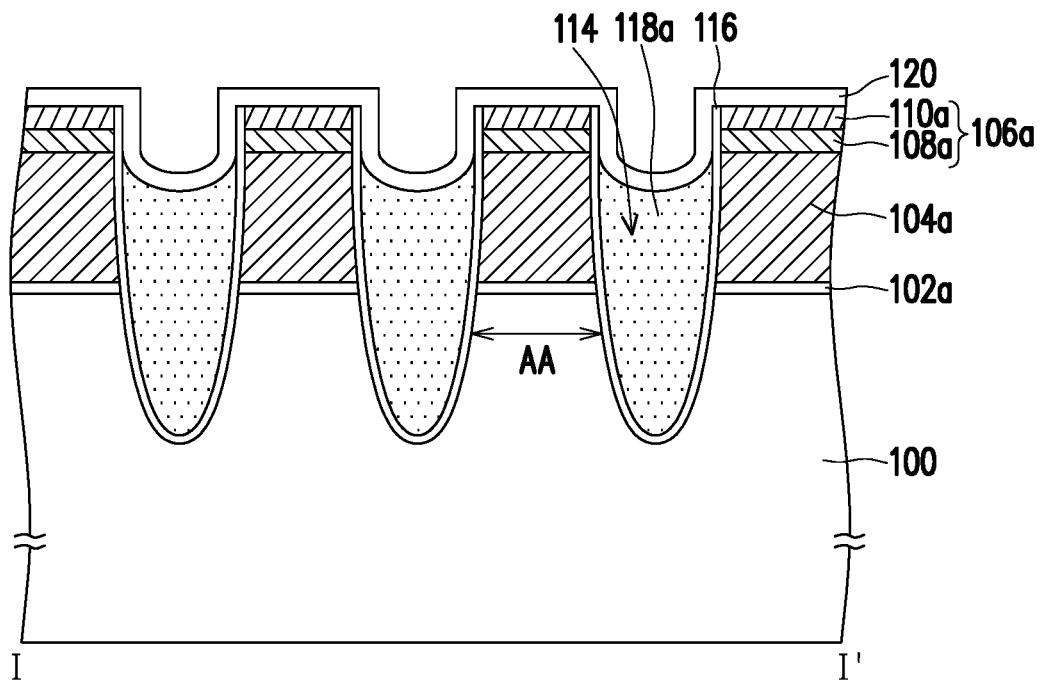

Referring to FIG. 2E, a side structure layer 120 covering the filling layer 118a may be conformally formed in the trench 114. The side structure layer 120 is made of, for example, silicon nitride. A method for forming the side structure layer 120 is, for example, an atomic layer deposition (ALD) method.

Figure 2F:
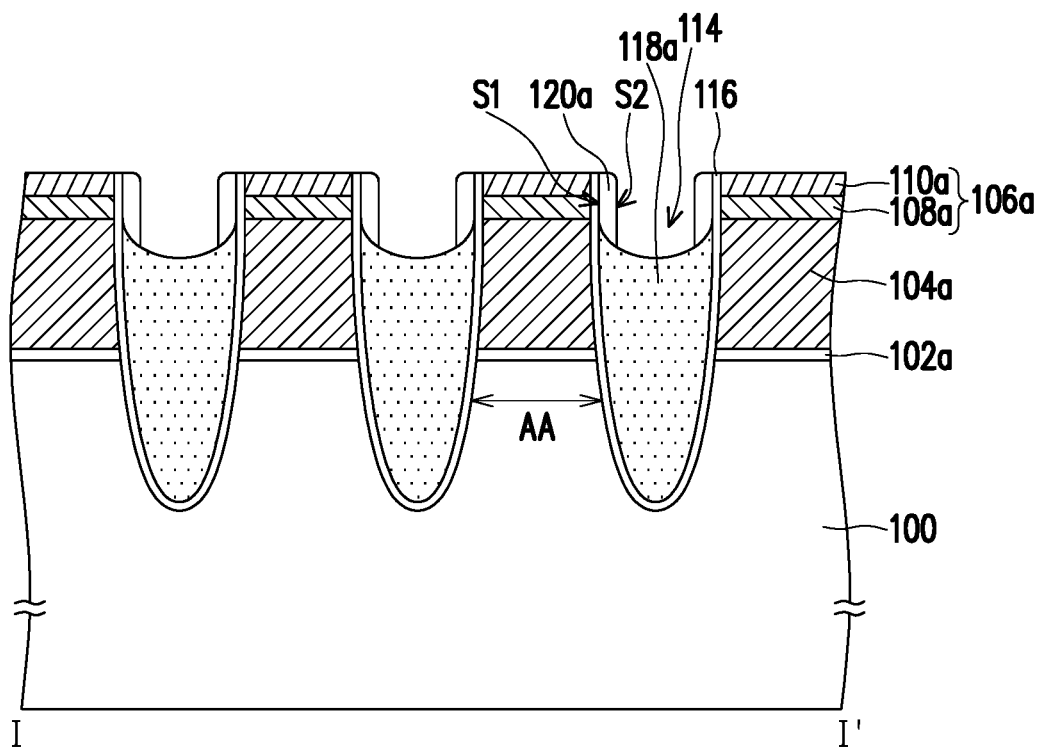

Referring to FIG. 2F, an etching process (for example, a dry etching process) is performed on the side structure layer 120, to form two side structures 120a on two sidewalls of a top of the trench 114 and expose the filling layer 118a. In the present embodiment, the side structure 120a may be located on the dielectric layer 116, but the disclosure is not limited thereto. In addition, through the dry etching process, the side structure layer 120 above the patterned hard mask layer 106a may further be removed to expose the patterned hard mask layer 106a. Each side structure 120a may have a first side S1 and a second side S2 opposite to each other. The first side S1 is closer to the adjacent patterned hard mask layer 106a than the second side S2, and a bottom of the first side S1 may be higher than a bottom of the second side S2. Accordingly, the shape of the side structure 120a may be made into a wing shape.

Figure 2G:
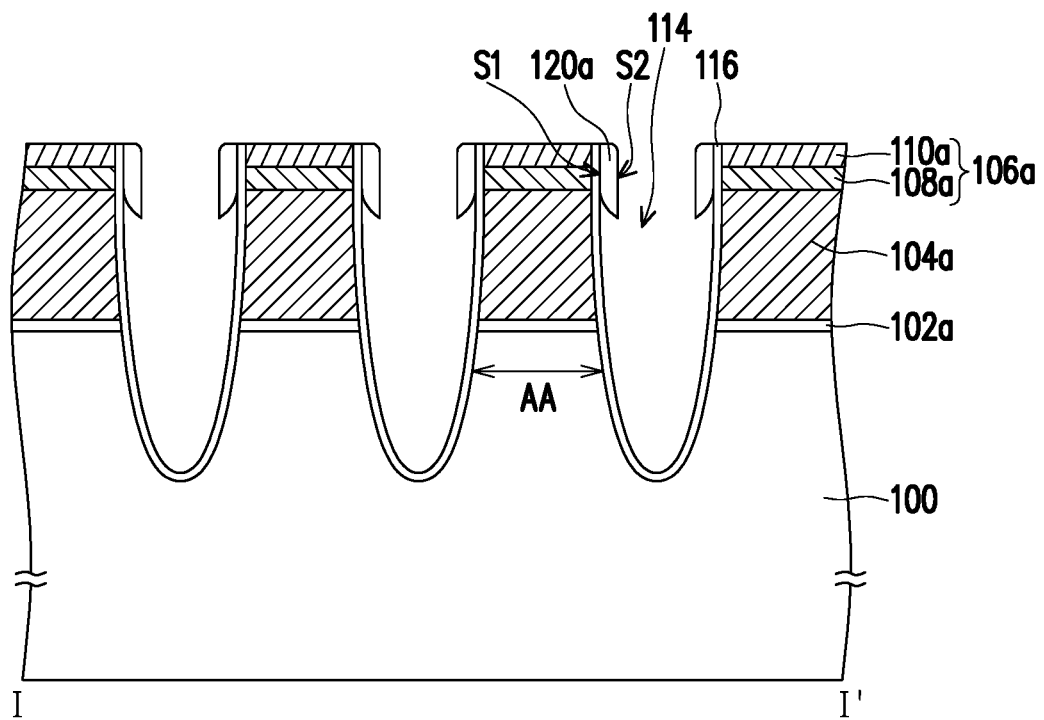

Referring to FIG. 2G, the filling layer 118a may be removed. The method for removing the filling layer 118a is, for example, a wet etching method. For example, when the filling layer 118a is made of spin on carbon and the side structure 120a is made of silicon nitride, since an SPM (a mixture of sulfuric acid and hydrogen peroxide) (that is, an SPOM) mixed with ozone has a high etching selectivity on the filling layer 118a and the side structure 120a, the SPOM may be used as a wet etchant to remove the filling layer 118a.

Figure 2H:
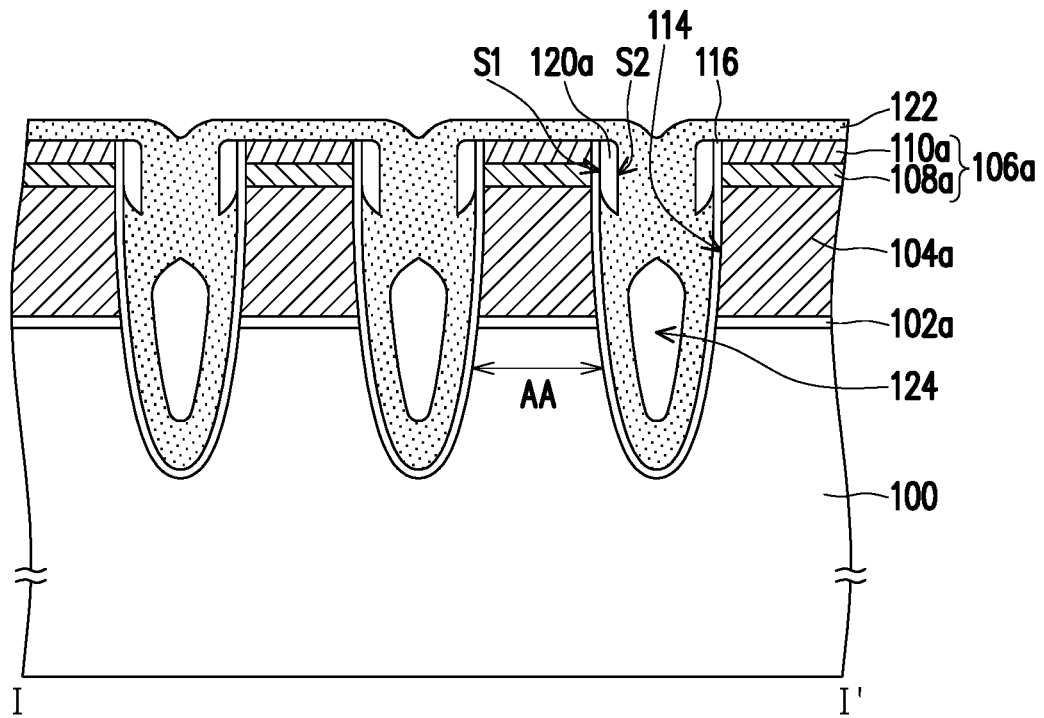

Referring to FIG. 2H, an isolation material layer 122 filling the trench 114 may be formed. The isolation material layer 122 covers the side structure 120a and the patterned hard mask layer 106a. In addition, an air gap 124 may be formed in the isolation material layer 122. The isolation material layer 122 is made of, for example, silicon oxide. A method for forming the isolation material layer 122 is, for example, a chemical vapor deposition method.

In addition, a size of the air gap 124 may be adjusted using a thickness of the side structure 120a. For example, when the thickness of the side structure 120a is larger, the isolation material layer 122 is less likely to fill the trench 114, and therefore a relatively large air gap 124 may be formed. When the thickness of the side structure 120a is smaller, the isolation material layer 122 is more likely to fill the trench 114, and therefore a relatively small air gap 124 may be formed.

Figure 2I:
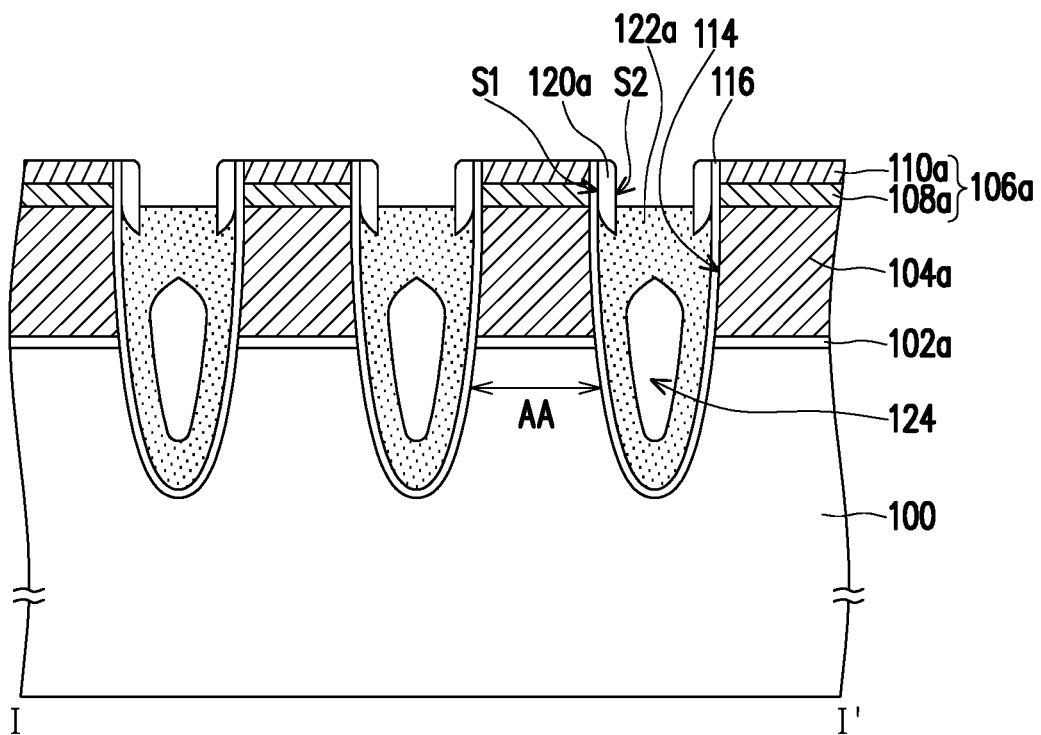

Referring to FIG. 2I, a portion of the isolation material layer 122 may be removed to form an isolation layer 122a in the trench 114 and expose a side structure 122a and a patterned hard mask layer 106a. A top of the isolation layer 122a may be higher than a bottom of the charge storage layer 104a. An air gap 124 may be provided in the isolation layer 122a. The air gap 124 may isolate at least a portion of two adjacent charge storage layers 104a, thereby reducing a coupling effect between the two adjacent charge storage layers 104a. The method for removing the portion of the isolation material layer 122 is, for example, a dry etching method.

Figure 2J:
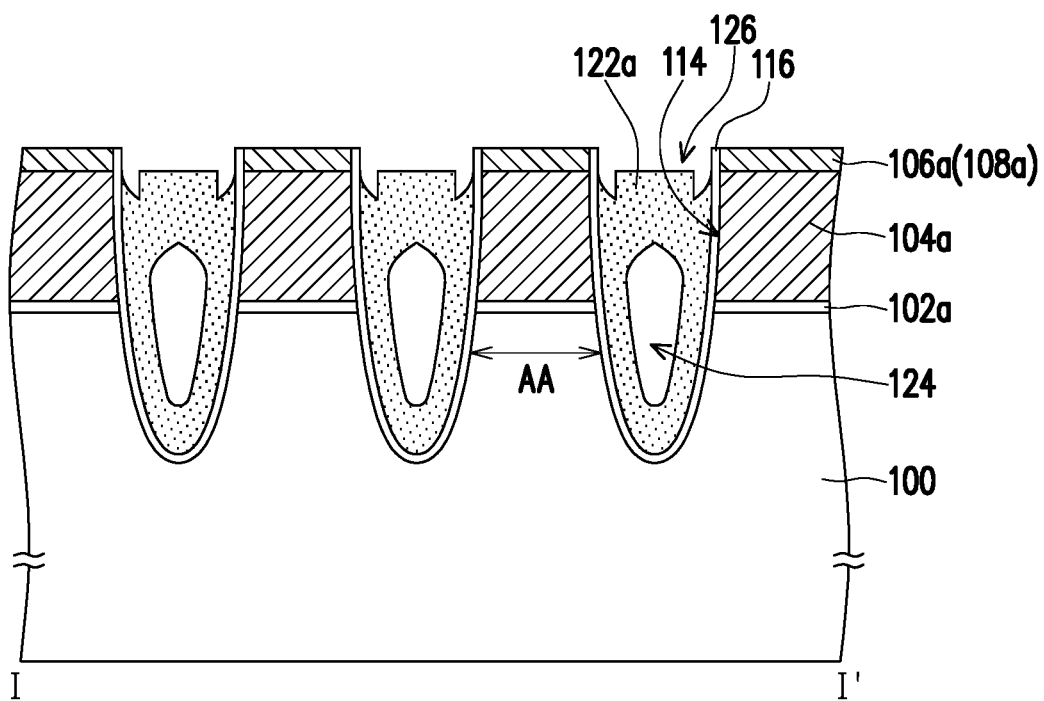

Referring to FIG. 2J, the side structure 120a may be removed to form an opening 126. The opening 126 is located above the isolation layer 122a. Two sides of a bottom of the opening 126 may be lower than a top of the isolation layer 122a. Accordingly, the opening 126 may be located between two adjacent charge storage layers 104a. The method for removing the side structure 120a is, for example, a wet etching method. In some embodiments, when the side structure 120a is made of silicon nitride, phosphoric acid may be used as an etchant to remove the side structure 120a. In addition, in the process of removing the side structure 120a, the mask layer 110a may also be removed, but the disclosure is not limited thereto.

Figure 2K:
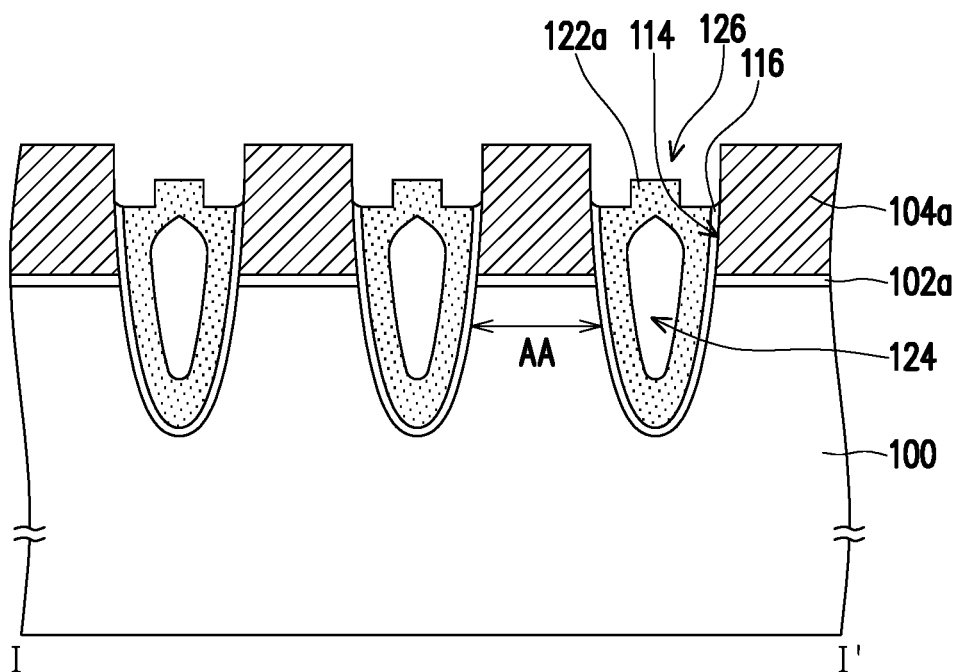

Referring to FIG. 2K, an etching process (such as a dry etching method) may be performed on the isolation layer 122a to adjust a height of the isolation layer 122a, so that the height of the isolation layer 122a is lower than a height of the charge storage layer 104a. In addition, the patterned hard mask layer 106a (the mask layer 108a) may be removed. For example, the patterned hard mask layer 106a (the mask layer 108a) may also be removed through the dry etching process, but the disclosure is not limited thereto. In addition, during the dry etching process, a portion of the dielectric layer 116 may also be removed. In other embodiments, the dry etching process performed on the isolation layer 122a may also be omitted.

Figure 2L:
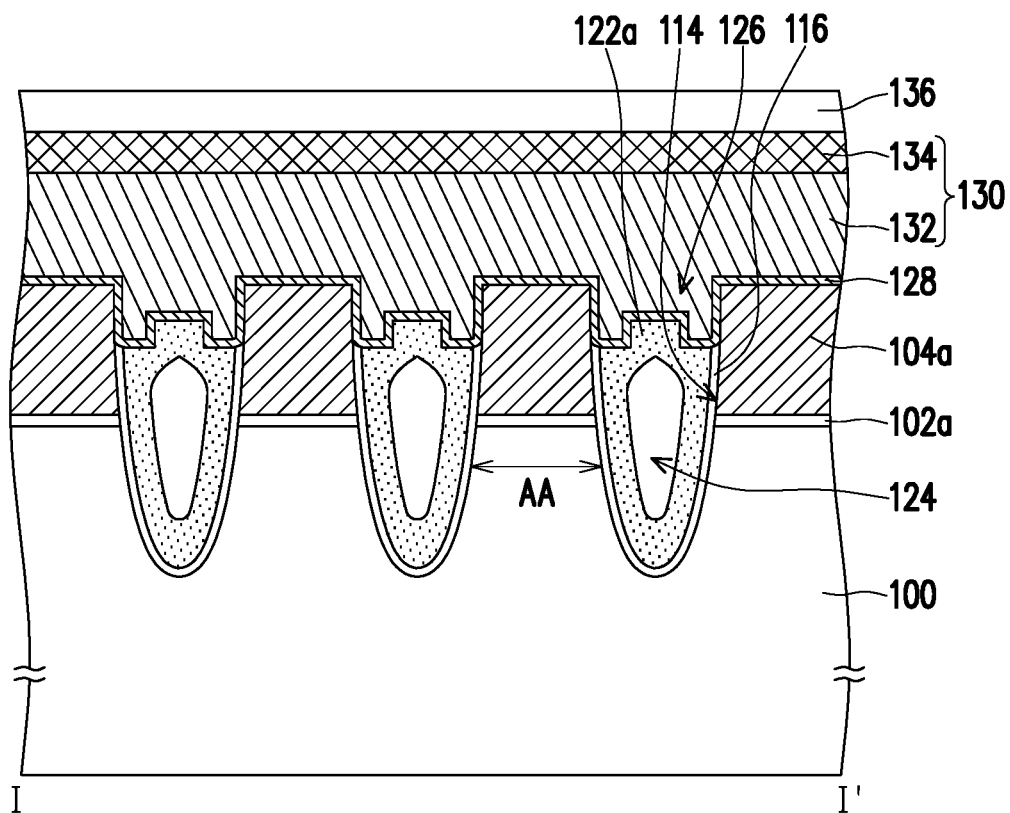

Referring to FIG. 2L, a dielectric layer 128 is formed on the charge storage layer 104a and on a surface of the opening 126. A bottom cross-sectional profile of the dielectric layer 128 located in the opening 126 is a profile that is recessed on both sides. Accordingly, the cross-sectional shape of the dielectric layer 128 may be made into a tooth root shape. The dielectric layer 128 may be a single-layer structure or a multilayer structure. The dielectric layer 128 may be made of, for example, silicon oxide, silicon nitride, or a combination thereof. For example, the dielectric layer 128 may be a composite layer of a silicon oxide layer/a silicon nitride layer/a silicon oxide layer. A method for forming the dielectric layer 128 is, for example, a chemical vapor deposition method.

Next, a control gate 130 is formed on the dielectric layer 128, the control gate 130 filling the opening 126. Since the control gate 130 fills the opening 126 and is located on the dielectric layer 128 having a recessed profile, a coupling ratio between the control gate 130 and the charge storage layer 104a may be effectively improved, and electrical performance of the memory device may further be improved. The control gate 130 may be a single-layer structure or a multilayer structure. In the present embodiment, the control gate 130 may include a polysilicon layer 132 and a metal layer 134. The polysilicon layer 132 is located on the dielectric layer 128. The polysilicon layer 132 may be a single-layer structure or a multilayer structure. The polysilicon layer 132 may be made of doped polysilicon, undoped polysilicon, or a combination thereof. The metal layer 134 is located on the polysilicon layer 132. The metal layer 134 may be made of a metal silicide, such as tungsten silicide (WSi), cobalt silicide (CoSi), or nickel silicide (NiSi). Then, a capping layer 136 may be formed on the control gate 130. The capping layer 136 is made of, for example, silicon nitride.

In addition, the method for forming the control gate 130 and the capping layer 136 may include the following steps, but the disclosure is not limited thereto. First, a control gate material layer (which may include a polysilicon material layer and a metal material layer) (not shown) and a capping material layer (not shown) may be sequentially formed on the dielectric layer 128. Then, the control gate material layer and the capping material layer may be patterned by a lithography process and an etching process to form the control gate 130 and the capping layer 136.

In the present embodiment, referring to FIG. 1, a plurality of control gates 130, a plurality of capping layers 136, and a plurality of active regions AA are used as examples for description, but the disclosure is not limited thereto. At least one control gate 130 and at least one capping layer 136 fall within the scope of the disclosure. A trench 138 may be formed between two adjacent control gates. In addition, the trench 138 may further be located between two adjacent capping layers 136. The plurality of control gates 130 may extend in a first direction D1 and may be arranged in a second direction D2. The plurality of capping layers 136 may extend in the first direction D1 and may be arranged in the second direction D2. In addition, the plurality of active regions AA may extend in the second direction D2 and may be arranged in the first direction D1. The first direction D1 intersects the second direction D2. For example, the first direction D1 may be perpendicular to the second direction D2.

Figure 2M:
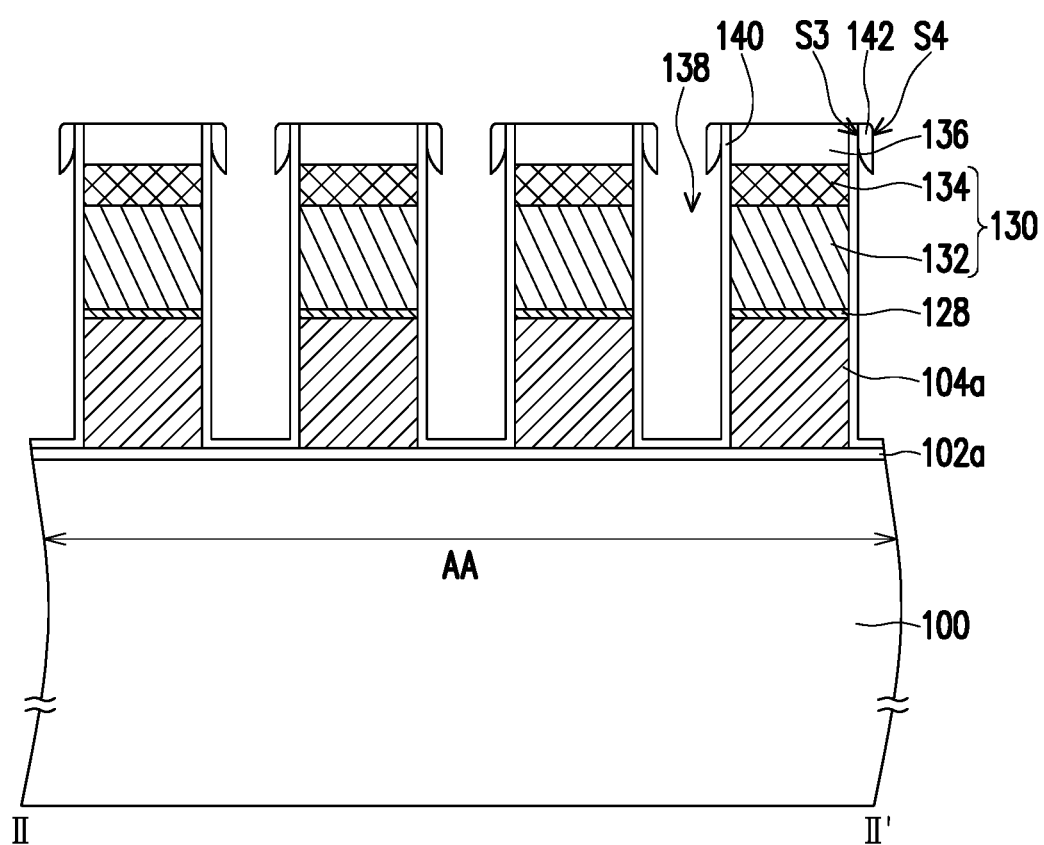
Figure 2N:
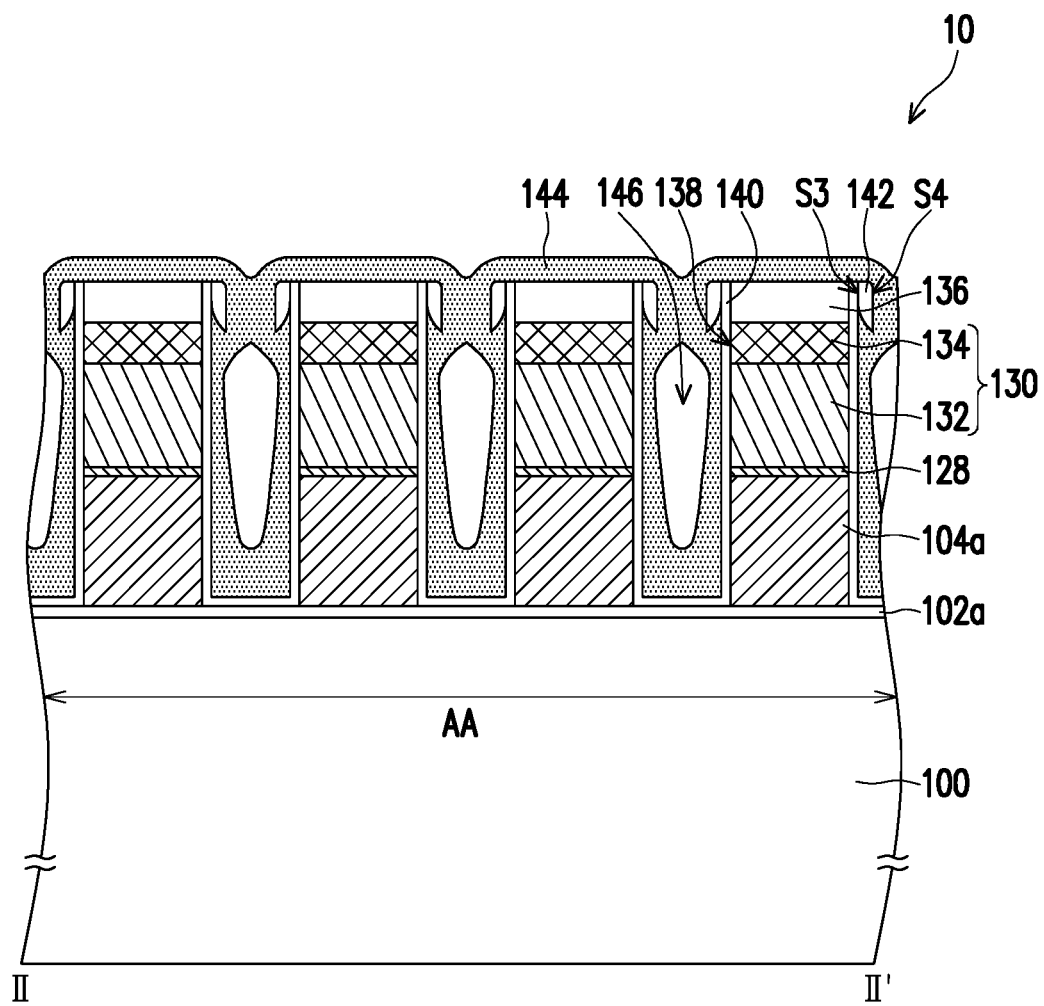

FIG. 2M and FIG. 2N are each a cross-sectional view taken along a section line II-II' in FIG. 1.

Referring to FIG. 2M, a dielectric layer 140 may be formed on a surface of the trench 138. The dielectric layer 140 is, for example, an oxide layer. A method for forming the dielectric layer 140 is, for example, a thermal oxidation method.

Next, two side structures 142 may be formed on two sidewalls of a top of the trench 138. In the present embodiment, the side structure 142 may be located on the dielectric layer 140, but the disclosure is not limited thereto. Each side structure 142 may have a first side S3 and a second side S4 opposite to each other. The first side S3 is closer to the adjacent capping layer 136 than the second side S4, and a bottom of the first side S3 may be higher than a bottom of the second side S4. Accordingly, a shape of the side structure 142 may be made into a wing shape. In addition, for the material of which the side structure 142 is made and the method for forming same, reference may be made to the material of which the side structure 120a is made and the method for forming same, and the descriptions thereof are omitted herein.

Referring to FIG. 2N, a dielectric layer 144 filling the trench 138 is formed. In addition, an air gap 146 may be provided in the dielectric layer 144. The air gap 146 may isolate at least a portion of two adjacent control gates 130, thereby reducing a coupling effect between the two adjacent control gates 130. The dielectric layer 144 is made of, for example, silicon oxide. A method for forming the dielectric layer 144 is, for example, a chemical vapor deposition method.

In addition, a size of the air gap 146 may be adjusted using a thickness of the side structure 142. For example, when the thickness of the side structure 142 is larger, the dielectric layer 144 is less likely to fill the trench 138, and therefore a relatively large air gap 146 may be formed. When the thickness of the side structure 142 is smaller, the dielectric layer 144 is more likely to fill the trench 138, and therefore a relatively small air gap 146 may be formed.

Based on the foregoing embodiments, it may be learned that, in the method for manufacturing the non-volatile memory structure 10, since the bottom cross-sectional profile of the dielectric layer 128 located in the opening 126 is a profile that is recessed on both sides, and the control gate 130 fills the opening 126 and is located on the dielectric layer 128 with a recessed profile, the coupling ratio between the control gate 130 and the charge storage layer 104a may be effectively improved, and the electrical performance of the memory device may also be improved.

A memory structure 10 of the present embodiment is described below with reference to FIG. 2L and FIG. 2N. In the present embodiment, the method for forming the memory device 10 is described using the foregoing method as an example, but the disclosure is not limited thereto.

Referring to FIG. 2L and FIG. 2N, a non-volatile memory structure 10 includes a substrate 100, a plurality of charge storage layers 104a, a dielectric layer 128, and a control gate 130. In addition, the non-volatile memory structure 10 may further include at least one of a gate dielectric layer 102a, a dielectric layer 116, an isolation layer 122a, a capping layer 136, a dielectric layer 140, a side structure 142, and a dielectric layer 144. The charge storage layer 104a is located on the substrate 100. An opening 126 is located between two adjacent charge storage layers 104a. The dielectric layer 128 is located on the charge storage layer 104a and on a surface of the opening 126. A bottom cross-sectional profile of the dielectric layer 128 located in the opening 126 is a profile that is recessed on both sides. The control gate 130 is located on the dielectric layer 128 and fills the opening 126. The gate dielectric layer 102a is located between the charge storage layer 104a and the substrate 100. The dielectric layer 116 is located on a surface of a trench 114. The isolation layer 122a is located in the substrate 100 between the two adjacent charge storage layers 104a. The capping layer 136 is located on the control gate 130. The dielectric layer 140 is located on a surface of the trench 138. The side structure 142 is located on two sidewalls of a top of the trench 138. The dielectric layer 144 fills the trench 138. In addition, the materials, features, forming method, and configuration of each component of the non-volatile memory structure 10 have been described in detail in the foregoing embodiments, and the descriptions thereof are omitted herein.

Based on the above, according to the non-volatile memory structure and the manufacturing method thereof of the foregoing embodiments, the coupling ratio between the control gate and the charge storage layers may be effectively increased, thereby improving the electrical performance of the memory device.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A non-volatile memory structure, comprising:
   a substrate;

a plurality of charge storage layers located on the substrate, wherein an opening is provided between two adjacent charge storage layers;
a first dielectric layer located on the plurality of charge storage layers and on a surface of the opening, wherein a bottom cross-sectional profile of the first dielectric layer located in the opening is a profile that is recessed on both sides, and the bottom cross-sectional profile of the first dielectric layer located in the opening comprises:
a first recess portion, a protruding portion, and a second recess portion, wherein the protruding portion protrudes in a direction away from the substrate, and the protruding portion is located between the first recess portion and the second recess portion;
a control gate located on the first dielectric layer and filling the opening, wherein the non-volatile memory structure comprises a plurality of control gates, the plurality of control gates extend in a first direction and are arranged in a second direction, the first direction intersects the second direction, and a trench is provided between two adjacent control gates;
a plurality of capping layers located on the plurality of control gates, wherein the plurality of capping layers extend in the first direction and are arranged in the second direction, and the trench is located between two adjacent capping layers; and
two side structures located on two sidewalls of a top of the trench, wherein each side structure comprises a first side and a second side opposite to each other, the first side is closer to the adjacent capping layer than the second side, and a bottom of the first side is higher than a bottom of the second side.

2. The non-volatile memory structure according to claim 1, further comprising:
an isolation layer located in the substrate between two adjacent charge storage layers, wherein the opening is located above the isolation layer, and both sides of a bottom of the opening are lower than a top of the isolation layer.

3. The non-volatile memory structure according to claim 2, wherein the top of the isolation layer is higher than bottoms of the plurality of charge storage layers, and an air gap is provided in the isolation layer.

4. The non-volatile memory structure according to claim 1, further comprising:
a second dielectric layer filling the trench.

5. The non-volatile memory structure according to claim 4, wherein an air gap is provided in the second dielectric layer.

6. The non-volatile memory structure according to claim 1, further comprising:
a plurality of gate dielectric layers located between the plurality of charge storage layers and the substrate.

7. A manufacturing method of a non-volatile memory structure, comprising:
forming a plurality of charge storage layers on a substrate, wherein an opening is provided between two adjacent charge storage layers;
forming a first dielectric layer on the plurality of charge storage layers and on a surface of the opening, wherein a bottom cross-sectional profile of the first dielectric layer located in the opening is a profile that is recessed on both sides, and the bottom cross-sectional profile of the first dielectric layer located in the opening comprises:
a first recess portion, a protruding portion, and a second recess portion, wherein the protruding portion protrudes in a direction away from the substrate, and the protruding portion is located between the first recess portion and the second recess portion;
forming a control gate on the first dielectric layer, wherein the control gate fills the opening, wherein
the method for forming the plurality of charge storage layers comprises:
forming a gate dielectric material layer on the substrate;
forming a charge storage material layer on the gate dielectric material layer;
forming a hard mask layer on the charge storage material layer; and
patterning the hard mask layer, the charge storage material layer, the gate dielectric material layer, and the substrate to form a patterned hard mask layer, the plurality of charge storage layers, and a plurality of gate dielectric layers and form a first trench in the substrate, wherein the first trench extends between two adjacent charge storage layers and into the patterned hard mask layer; and
forming an isolation layer in the first trench, wherein the opening is located above the isolation layer, and both sides of a bottom of the opening are lower than a top of the isolation layer, wherein the method for forming the isolation layer comprises:
forming a filling layer in the first trench, wherein a top of the fillet lave is lower than a top of the patterned hard mask layer;
conformally forming a side structure layer covering the filling layer in the first trench;
performing an etching process on the side structure layer to form two first side structures on two sidewalls of a top of the first trench and expose the filling layer;
removing the filling layer;
forming an isolation material layer filling the first trench, wherein the isolation material layer covers the two first side structures and the patterned hard mask layer; and
removing a portion of the isolation material layer to form the isolation layer in the first trench and expose the two first side structures and the patterned hard mask layer.

8. The manufacturing method of the non-volatile memory structure according to claim 7, further comprising:
removing the two first side structures to form the opening before the first dielectric layer is formed; and
removing the patterned mask layer before the first dielectric layer is formed.

9. The manufacturing method of the non-volatile memory structure according to claim 7, further comprising:
performing an etching process on the isolation layer to adjust a height of the isolation layer, so that the height of the isolation layer is lower than heights of the plurality of charge storage layers.

10. The manufacturing method of the non-volatile memory structure according to claim 7, wherein when the non-volatile memory structure comprises a plurality of control gates, the plurality of control gates extend in a first direction and are arranged in a second direction, the first direction intersects the second direction, and a second trench is provided between two adjacent control gates.

11. The manufacturing method of the non-volatile memory structure according to claim 10, further comprising:

forming a plurality of capping layers on the plurality of control gates, wherein the plurality of capping layers extend in the first direction and are arranged in the second direction, and the second trench is located between two adjacent capping layers.

12. The manufacturing method of the non-volatile memory structure according to claim 11, further comprising:
   forming two second side structures on two sidewalls of a top of the second trench.

13. The manufacturing method of the non-volatile memory structure according to claim 12, further comprising:
   forming a second dielectric layer filling the second trench.

\* \* \* \* \*